United States Patent
Fricke et al.

(10) Patent No.: US 9,536,030 B2
(45) Date of Patent: Jan. 3, 2017

(54) OPTIMIZATION OF INTEGRATED CIRCUIT PHYSICAL DESIGN

(71) Applicant: International Business Machines Corporation, Armonk, NY (US)

(72) Inventors: Niels Fricke, Herrenberg (DE); Karsten Muuss, Niederkassel (DE); Peter Verwegen, Rottenburg (DE); Christoph W. Wandel, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 14/302,484

(22) Filed: Jun. 12, 2014

(65) Prior Publication Data

US 2015/0363531 A1 Dec. 17, 2015

(51) Int. Cl.
*G06F 17/50* (2006.01)

(52) U.S. Cl.
CPC ....... *G06F 17/5072* (2013.01); *G06F 17/5077* (2013.01); *G06F 17/5081* (2013.01)

(58) Field of Classification Search
CPC .............. G06F 17/5072; G06F 17/5077; G06F 17/5081
See application file for complete search history.

(56) References Cited

U.S. PATENT DOCUMENTS

| | | | | | |
|---|---|---|---|---|---|
| 5,889,677 A | * | 3/1999 | Yasuda | ............... | G06F 17/5022 716/113 |
| 6,166,572 A | * | 12/2000 | Yamaoka | ................. | H03L 7/07 327/149 |
| 6,493,660 B2 | * | 12/2002 | Saito | .................... | G06F 17/5031 703/19 |
| 6,718,531 B2 | * | 4/2004 | Katayose | ............ | G06F 17/5068 716/114 |
| 6,832,362 B2 | * | 12/2004 | Nuber | ................. | G06F 17/5072 716/114 |
| 6,954,915 B2 | * | 10/2005 | Batchelor | ........... | G06F 17/5031 716/113 |
| 7,429,944 B1 | * | 9/2008 | Nairn | ....................... | G06F 1/08 341/155 |

(Continued)

OTHER PUBLICATIONS

US 8,271,920, Nov. 2013, McElvain et al. (withdrawn).

(Continued)

*Primary Examiner* — Naum B Levin
(74) *Attorney, Agent, or Firm* — Gilbert Harmon, Jr.

(57) ABSTRACT

According to one embodiment of the present invention, a method for optimizing an integrated circuit design is provided. The method may include identifying one or more nets crossing a boundary between a parent block, having parent logic, and a child block, having child logic. The method may include inserting interior buffers on the nets inside of the child block and exterior buffers on the nets outside of the child block and inside of the parent block, wherein the interior buffers and the exterior buffers define a buffer pair for each of the nets. The method may further include determining a first placement for the parent logic and a second placement for the child logic, such that the buffers of the buffer pair for each net are placed substantially near to one another. The method may further include determining pin locations for the child block based on the second placement.

20 Claims, 5 Drawing Sheets

(56) References Cited

U.S. PATENT DOCUMENTS

| | | | |
|---|---|---|---|
| 8,104,012 B1* | 1/2012 | Klein et al. | G06F 17/505 716/105 |
| 8,205,182 B1* | 6/2012 | Zlatanovici | G06F 17/505 703/16 |
| 8,271,920 B2 | 9/2012 | Cho et al. | |
| 8,316,335 B2 | 11/2012 | Barowski et al. | |
| 8,332,798 B2 | 12/2012 | Chandra et al. | |
| 8,375,345 B1 | 2/2013 | Barowski et al. | |
| 8,560,983 B2 | 10/2013 | Brandt et al. | |
| 8,566,765 B1* | 10/2013 | Tzeng | G06F 17/5031 716/106 |
| 8,640,075 B2* | 1/2014 | Alpert | G06F 17/505 716/134 |
| 8,977,995 B1* | 3/2015 | Arora | G06F 17/505 716/105 |
| 9,098,669 B1* | 8/2015 | Alpert | G06F 17/5072 |
| 2012/0254818 A1* | 10/2012 | Liu | G06F 17/505 716/124 |
| 2013/0055187 A1* | 2/2013 | Hiromitsu | G06F 17/5072 716/122 |
| 2013/0326455 A1 | 12/2013 | Alpert et al. | |

OTHER PUBLICATIONS

Babu et al., "Comparision of Hierarchial Mixed-Size Placement Algorithms for VLSI Physical Synthesis", 2011 International Conference on Communication Systems and Network Technologies, Jun. 3-5, 2011, pp. 430-435, © 2011 IEEE, 978-0-7695-4437-3/11, DOI 10.1109/CSNT.2011.95.

Osler, Peter J., "Placement Driven Synthesis Case Studies on Two Sets of Two Chips: Hierarchical and Flat", ISPD '04, Apr. 18-21, 2004, pp. 190-197, Phoenix, Arizona, USA, Copyright 2004 ACM, 1-58113-817-2/04/0004.

Struzyna, Markus, "Flow-based Partitioning and Fast Global Placement in Chip Design", Disertation Rheinischen Friedrich-Wilhelms-Universitat, Bonn, Germany, pp. 1-155, Jul. 2010, Tag der Promotion: Sep. 30, 2010.

* cited by examiner

OPTIMIZATION OF INTEGRATED CIRCUIT PHYSICAL DESIGN

BACKGROUND OF THE INVENTION

The present invention relates generally to the field of integrated circuit (IC) design, and more particularly to placement and optimization of components during the physical design stage of IC design.

IC design can be broken down into multiple stages of design. In the initial stages of IC design, circuit specifications, architectural design, and logic design are completed. The completion of the logic design stage typically results in a computer software model that describes the structure, design, and operation of the IC. The model can be written in one or more of a variety of computer readable languages, commonly called a hardware description language (HDL). A common hardware description language is the very high speed integrated circuit (VHSIC) hardware description language (VHDL). The HDL model can include descriptions of certain areas of the IC which are considered "timing critical," which means that the time frame in which information is conveyed through the circuit in the form of signals needs to be designed in an accurate manner to ensure the correct operation of the IC as a whole.

In the physical design stage of IC design, engineers use the HDL model to generate physical parameters of the components that make up the IC. Physical design uses electronic design automation (EDA) tools to model the physical attributes of the IC. EDA tools use two main strategies to perform physical design: flat design and hierarchical design. In a flat design, the EDA tool places all of the components in the IC at once. Hierarchical design presents a divide and conquer approach in which certain subsets of the IC components are placed separately and later inserted into the complete parent design. The subsets of the circuit that are modeled separately are called "child blocks" and, when built, will be self-contained as a single unit having one or more pins connecting the child block components to the parent block components.

SUMMARY

According to one embodiment of the present invention, a method for optimizing an integrated circuit design is provided. The method may include identifying one or more nets crossing a boundary between a parent block, having parent logic, and a child block, having child logic. The method may further include inserting one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets. The method may further include determining a first placement for the parent logic and a second placement for the child logic, such that the at least one interior buffer and the at least one exterior buffer in the buffer pair for each net are placed substantially near to one another. The method may further include determining one or more pin locations for the child block based, at least in part, on the second placement for the child logic.

According to another embodiment, a computer program product for optimizing an integrated circuit design is provided. The computer program product may include one or more computer-readable storage media and program instructions stored on the one or more computer-readable storage media. The program instructions may include program instructions to identify one or more nets crossing a boundary between a parent block, having parent logic, and a child block, having child logic. The program instructions may further include program instructions to insert one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets. The program instructions may further include program instructions to determine a first placement for the parent logic and a second placement for the child logic, such that the at least one interior buffer and the at least one exterior buffer in the buffer pair for each net are placed substantially near to one another. The program instructions may further include program instructions to determine one or more pin locations for the child block based, at least in part, on the second placement for the child logic.

According to another embodiment, a computer system for optimizing an integrated circuit design is provided. The computer system may include one or more computer processors. The computer system may further include one or more computer-readable storage media and program instructions stored on the computer-readable storage media for execution by at least one of the one or more processors. The program instructions may include program instructions to identify one or more nets crossing a boundary between a parent block, having parent logic, and a child block, having child logic. The program instructions may further include program instructions to insert one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets. The program instructions may further include program instructions to determine a first placement for the parent logic and a second placement for the child logic, such that the at least one interior buffer and the at least one exterior buffer in the buffer pair for each net are placed substantially near to one another. The program instructions may further include program instructions to determine one or more pin locations for the child block based, at least in part, on the second placement for the child logic.

DETAILED DESCRIPTION

Embodiments of the present invention recognize that performing a completely flat placement and optimization on the IC will place all of the logic in a single step. However, the EDA tool has a limited amount of time in which to perform the placement and optimization. With the number of components in an IC increasing at a rapid pace, flat placements become impractical because of the size of the circuits being modeled. Hierarchical approaches allow physical designers to divide and conquer in the design. However, hierarchical approaches require an additional trade off in the placement of the logical components in the circuit. Because, in a hierarchical approach, the logic of the top-level (parent) block is placed and optimized separately from one or more lower-level (child) blocks, the placement of components on one level is completed without consideration of where the logic is on a higher or lower level. As a result, physical designers must choose which block (parent or child) to place first.

For example, the EDA tool can perform the placement and optimization on the parent level first, which will result in a satisfactory placement of the parent-level logic and will define the pin locations of the child block based on the parent level logic. This strategy is not ideal because of the possibility of the existence of a better (from a physical design and timing standpoint) design which would result in different pin locations. Generally, performing a parent level placement first limits the child block placement because the pins are predefined prior to determining the child block design.

Alternatively, the EDA tool can perform the placement and optimization on the child block first. According to this strategy, the pins of the child block (i.e., the physical location where the logic inside the child block connects to the logic outside of the child block) is determined solely based on the best placement that the EDA tool generates for the child block without reference to the parent block. This strategy imposes an equal and opposite limitation in which the pin locations for the child are placed without regard to the parent block logic and, therefore, disregard the possibility of a better placement if both the child block logic and the parent block logic are placed together. Embodiments of the present invention disclose a hybrid approach in which the EDA tool executes a complete, flat initial placement in order to determine near-optimal I/O pin locations for one or more child blocks prior to performing a separate placement and optimization on each child block and replacing the initially flat placed child blocks with the separately placed and optimized child blocks.

Figure 1:
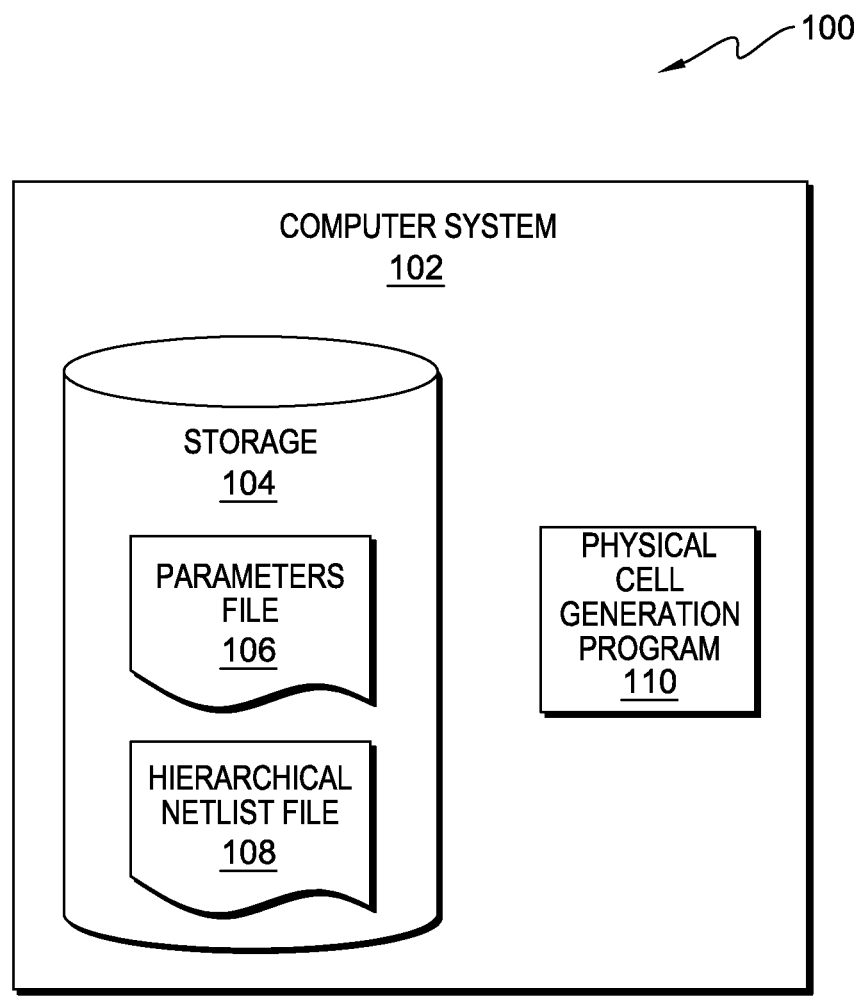
FIG. 1 is a functional block diagram illustrating a physical design computing environment, in accordance with an embodiment of the present invention.

Embodiments of the present invention will now be described in detail with reference to the Figures. FIG. 1 is a functional block diagram illustrating a physical design computing environment (environment), generally designated 100, in accordance with an embodiment of the present invention. Environment 100 includes computer system 102.

Computer system 102 can be, for example, a desktop computer, a laptop computer, a tablet computer, a specialized computer server, a smartphone, or any other computer system known in the art. In certain embodiments, computer system 102 represents a computer system utilizing clustered computers and components that act as a single pool of seamless resources when accessed over a network (not shown), as is common in data centers and with cloud computing applications. In general, computer system 102 is representative of any programmable electronic device or combination of programmable electronic devices capable of executing machine-readable program instructions. Exemplary components of computer system 102 are described in greater detail with respect to FIG. 5. Computer system 102 includes storage 104 and physical cell generation program 110.

Storage 104 is a computer readable storage device that maintains information detailing the size and locations of various child blocks within an IC design and the logical netlist for the complete IC design. In various embodiments, storage 104 can be a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device, such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Storage 104 includes parameters file 106 and hierarchical netlist file 108.

Parameters file 106 is a computer-readable file that defines one or more child blocks within a parent block. In various embodiments, parameters file 106 can include, for example, the number and logical contents of one or more child blocks and/or specific movebounds that apply to the one or more child blocks. A movebound is a particular area within the parent block in which certain logical components must be placed by the EDA tool. Movebounds can also be "exclusive." An exclusive movebound is an area within the parent block in which certain logical components must be placed and in which no other components can be placed.

Hierarchical netlist file 108 is a computer readable file that describes the logical structure and interconnections (nets) of the IC design. In various embodiments, hierarchical netlist file 108 includes HDL programming code that describes a set of logical components and interconnections between those components that make up an IC. In some embodiments, specific subgroups of logical components represent discrete functions and can be considered, in a hierarchical structure, to be individual sub-blocks (i.e., child blocks) of the parent block. Hierarchical netlist file 108 includes information describing which specific logical components may be taken as a single child block and whether the particular child block is timing critical. In certain ICs, various functions can be timing critical; that is, the amount of time required for an input signal to be processed and an output signal generated is determinative of the overall function of the IC. In such cases, the physical placement of the logical components, and the length of the nets connecting those components, can be important to the design and operation of the IC.

Physical cell generation program 110 is a set of computer readable instructions for generating input/output (I/O) locations (i.e., pin locations) for child blocks within the parent block of an IC. In various embodiments, physical cell generation program 110 accesses and uses hierarchical netlist file 108 and parameters file 106 to conduct a flat placement of the parent block and child blocks. Based on the completely flat placement, physical cell generation program 110 determines pin locations for each child block. Physical cell generation program 110 then conducts a second placement and optimization for each child block based on the pin locations determined by the complete flat netlist placement. The placement and optimization conducted on the child blocks alone can replace the child blocks in the hierarchical netlist.

Figure 2:
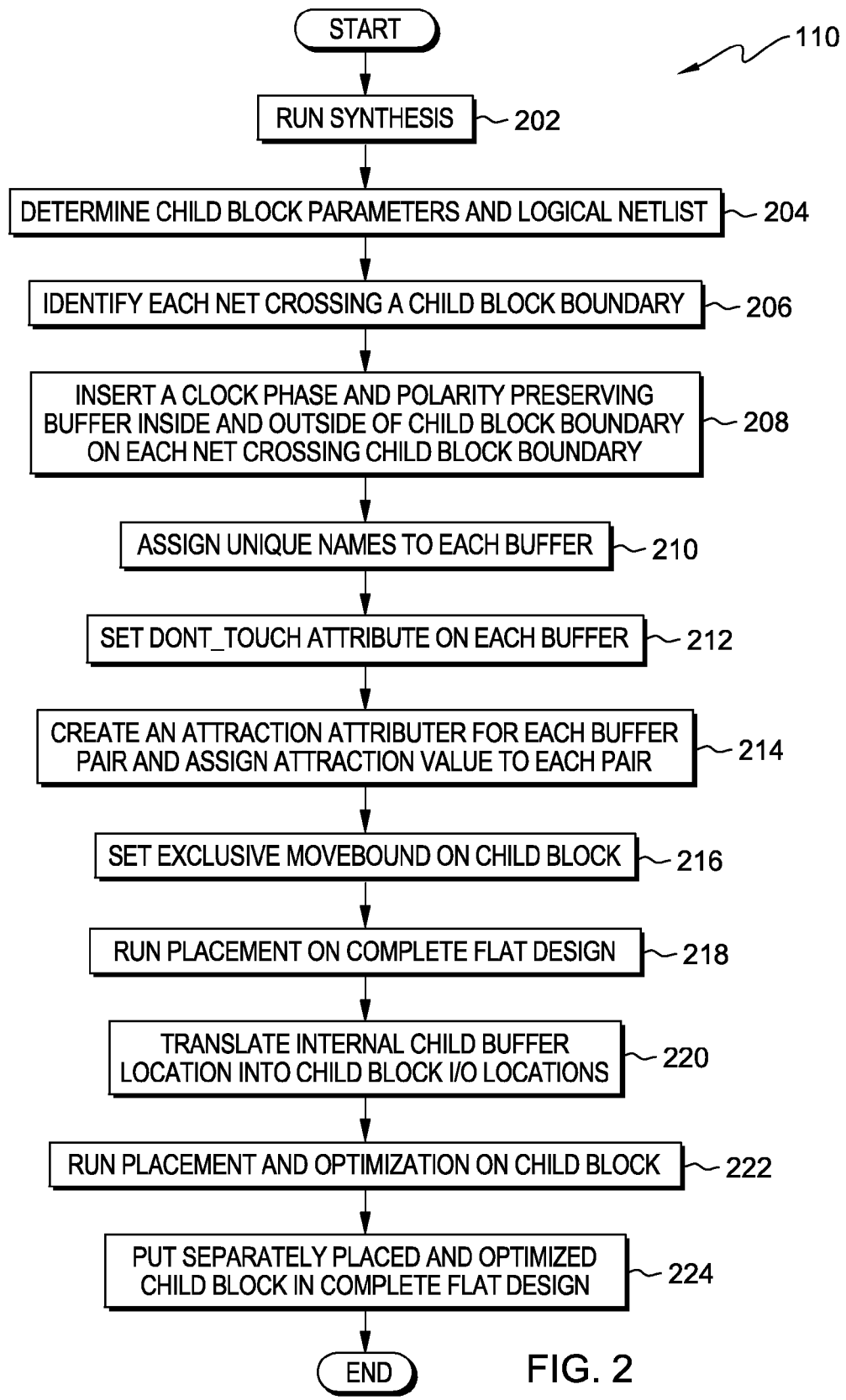
FIG. 2 is a flowchart depicting operational steps of a physical cell generation program, on a computer system within the environment of FIG. 1, in accordance with an embodiment of the present invention.

FIG. 2 is a flowchart depicting operational steps of physical cell generation program 110, on computer system 102 within the environment of FIG. 1, in accordance with an exemplary embodiment of the present invention.

Physical cell generation program 110 runs a synthesis (step 202). Physical cell generation program 110 accesses and translates information in hierarchical netlist file 108, which may be, for example, a VHDL file that describes all of the logic and connections in the IC. In the exemplary embodiment, physical cell generation program 110 translates the information included in hierarchical netlist file 108 into a technology-based netlist for a certain type of chip technology (e.g., C14 complementary metal-oxide-semiconductors). In general, synthesis translates the description of the IC circuitry from a computer readable language, such as VHDL, to a representation of the circuitry with physical characteristics, such as area.

Physical cell generation program 110 determines the child block parameters and the logical netlist of the IC (step 204). In the exemplary embodiment, the child block parameters (i.e., size and location of the child block) are defined in parameters file 106, and the logical netlist (i.e., logical components of the IC) is defined in hierarchical netlist file 108. In the exemplary embodiment, the child blocks define specific logical components in the netlist that are "timing critical," which means that the lengths of nets and the time it takes the circuit to perform specific functions affects the functionality of the IC as a whole. In some embodiments, a design engineer defines the child blocks in parameters file 106 for access by physical cell generation program 110 by specifying the "movebounds," or physical size and location, of one or more child blocks. In various embodiments, a logical design engineer defines the logic of the IC according to the desired specifications and functionality of the circuit. The logic can be described in hierarchical netlist file 108 which can be written in an HDL, such as VHDL. In general, physical cell generation program 110 can use any means known in the art to determine the child block parameters and the logical netlist of the IC undergoing physical design.

Physical cell generation program 110 identifies each net crossing a child block boundary (step 206). Because hierarchical netlist file 108 is written hierarchically, one or more child blocks may be included within the parent block. The locations where the nets cross from the parent block into the child block(s) represent the physical locations of I/O pins on the child block. In the exemplary embodiment, physical cell generation program 110 locates each net crossing from the parent level logic into a child block by accessing the information included in parameters file 106 and hierarchical netlist file 108. Physical cell generation program 110 identifies the nets in hierarchical netlist file 108 by identifying each I/O pin associated with the child block. In various embodiments, each child block included in hierarchical netlist file 108 has a unique identifying name, and each pin of each child block has its own unique identifying name. The identification of nets that cross the boundary of a child block enables physical cell generation program 110 to insert buffer pairs on each net and execute a flat placement in order to obtain I/O pin locations for the child block that considers both the parent level logic and the child block logic.

Physical cell generation program 110 inserts a clock phase and polarity preserving buffer inside and outside of the child block boundary on each net crossing the child block boundary (Step 208). In the exemplary embodiment, physical cell generation program 110 places two buffers for each I/O pin on the child block. Physical cell generation program 110 places one buffer in the parent level block between the parent level logic and the child block boundary, and physical cell generation program 110 places a second buffer inside of the child block between the child block boundary and the child block logic. In various embodiments, physical cell generation program 110 identifies each I/O pin location for the child block, which is the location where a net crosses the child block boundary, and inserts a clock phase and polarity preserving buffer on each side of the boundary. The polarity of a signal in a digital circuit is typically identified as "true" or "complement," or '1' or '0.' The clock is a critical signal which determines the time frame in which operation cycles of a circuit occur. In various embodiments, the buffer can be any type of clock phase and polarity preserving circuit element(s). For example, a two-input XOR gate can be used as a buffer where one of the inputs is set to ground and the other input is the I/O input crossing the child block boundary. In an alternative embodiment, the two buffers can be inverters so that a signal will be inverted before crossing the child block boundary and then inverted again within the child block prior to reaching the internal logic of the child block. In other embodiments, different circuits may be used to model the buffers. In general, the buffers can be any electrical circuit elements that preserve the polarity of the signals entering or leaving the parent block logic on a net and the signals entering or leaving the child block logic on a net, as well as the clock phase of the signals on the net.

Physical cell generation program 110 assigns a unique name to each buffer (step 210). In the exemplary embodiment, physical cell generation program 110 cycles through each of the buffers created in step 208 and defines a unique name for each buffer. The unique names allow the EDA tool and physical cell generation program 110 to identify the buffers by name and perform operations on the buffers. In some embodiments, physical cell generation program 110 can also assign unique names to multiple instances of the same child block within the parent block. In some embodiments, a single parent block can have multiple instances of the same child block. However, the multiple instances of the child block will be in different physical locations and, therefore, have different satisfactory placements (as determined by the specifications of the IC) for the I/O pins and the logic within the child blocks. By assigning unique names to both the buffers and multiple instances of the child blocks, physical cell generation program 110 can perform operations on the buffers for each child block individually, and satisfactory pin placements for each child can be determined individually.

Physical cell generation program 110 sets a "DON'T_TOUCH" attribute on each buffer (step 212). Physical cell generation program 110 cycles through each buffer generated in step 208 by name and assigns an attribute to each buffer that indicates that, when a placement and optimization is run, the object to which the attribute is assigned should not be modified. In various embodiments, the HDL includes a "DON'T_TOUCH" attribute that is associated with a Boolean input. In the exemplary embodiment, physical cell generation program 110 assigns a "DON'T_TOUCH" attribute to each buffer created and named in steps 208 and 210, respectively, and sets the Boolean value to TRUE to indicate that the buffer should not be modified in a placement and optimization run on the complete, flat netlist. For example, in one embodiment, the "DON'T_TOUCH" attribute prevents physical cell generation program 110 from changing the network connectivity and the size of each buffer during a placement and optimization. In other embodiments, physical cell generation program 110 can use any means known in the art to ensure that the buffers are not modified during a placement and optimization process run by an EDA tool.

Physical cell generation program 110 creates an attraction attribute for each buffer pair and assigns an attraction value for each pair (step 214). In the exemplary embodiment, physical cell generation program 110 identifies each buffer using the names assigned in step 210, and then locates one or more buffers connected to the identified buffer with a net. Physical cell generation program 110 creates and assigns an attribute to each buffer that identifies the buffer to which it is connected and indicates that those buffers should be placed near each other when a placement and optimization is run. For example, physical cell generation program 110 can iterate through each buffer inside of the child block and identify each buffer outside of the child block by name that connects to a buffer inside of the child block with a net. Physical cell generation program 110 can then create an attribute on each buffer in a connected pair and assign a value to the attribute that indicates that during a placement and optimization, the two buffers should be placed as close together as possible within the limitations of the EDA tool and the requirements/limitations of the IC chip technology. In one embodiment, each buffer located on the inside of the child block is attached to exactly one buffer in the parent block.

In an embodiment, physical cell generation program 110 generates an attraction file that includes the names of connected buffers and the attraction value associated with the pair. The EDA tool accesses the attraction file during a placement and determines the locations of the buffers based on the attraction value of a given pair. Attraction attributes are a specific type of attribute in an EDA tool that indicate how closely one or more electrical components should be placed together. For example, a standard, low-level of attraction may have a value of one (1) or two (2), while a high level of attraction may be indicated by a value of 100. Some connections in the IC are assigned attraction values by the EDA tool as a standard operation of the placement and optimization process. In one embodiment of the present invention, physical cell generation program 110 sets an attraction attribute value for each connected buffer pair to 100. In other embodiments, the attraction attribute value can be any value sufficient to indicate that the buffers in a buffer pair are highly attracted to each other, when compared to other electrical components in the child and parent blocks. In general, the attraction value can be set to any value that indicates that when the EDA tool conducts a placement and optimization, the buffers should be placed as close as possible to each other without the buffers crossing the movebound of the child block.

Physical cell generation program 110 sets an exclusive movebound on the child block (step 216). In the exemplary embodiment, physical cell generation program 110 accesses parameters file 106, which identifies the movebounds by the size and location of the child block and associates an exclusive attribute with the movebound. An exclusive movebound defines a particular area (i.e., the area of the child block) in which the EDA tool will only place components that are part of the child block. The exclusive movebound prevents any components other than those that are part of the child block from being placed within the boundaries of the exclusive movebound by the EDA tool during a complete flat placement and optimization. In the exemplary embodiment, each child block movebound, as described in parameters file 106, has a unique name, and physical cell generation program 110 iterates through each of the child blocks and adds a key word to the movebound indicating that the movebound is exclusive.

Physical cell generation program 110 runs a placement and optimization on the complete flat design (step 218). As discussed above, the complete flat design is one in which all of the logic is placed together, including the logic inside of the parent block and all child blocks. The flat design is opposed to the hierarchical design, in which the internal logic of the child blocks is not placed at the same time the parent block is placed. In the exemplary embodiment, physical cell generation program 110 instructs the EDA tool perform the placement and optimization on the complete flat design (which includes the logic inside of the child blocks), but the EDA tool places the logic according to the locations and sizes (areas) of the child blocks as described in parameters file 106, according to the exclusive movebounds set on the child block boundaries in step 216, and according to the attraction attributes assigned to one or more buffer pairs in step 214. The placement and optimization places the buffers in each buffer pair substantially near to one another, which means that the buffers are placed as close together as possible within the limitations of the EDA tool, such as the exclusive movebounds set in parameters file 106 and the timing and performance specifications of the IC. The flat placement and optimization results in a placement of the parent level logic that emphasizes the connections between the buffer pairs by executing the placement based on the attraction attributes assigned to the buffers inserted into the circuit.

In various embodiments, the complete flat placement results in a complete placement of the logic, wherein buffer pairs are placed at or near the exclusive movebounds because the relative attraction between the buffers as specified by the attraction attributes instructs the EDA tool to place the buffers as near to each other as possible without crossing the exclusive movebounds and without the child block buffers overlapping. Each buffer in the pair is placed as near to its corresponding buffer as possible within the rules of the EDA tool's placement and optimization functionality. Therefore, in the exemplary embodiment, the complete flat placement results in a buffer inside of the child block immediately adjacent to the exclusive movebound of the child block and the corresponding buffer on the outside of the child block placed immediately on the outside of the exclusive movebound of the child block, connected to the internal buffer by a net. The proximity of the two buffers in the buffer pair is determined according to the high attraction value relative to the other set in step 214.

Physical cell generation program 110 translates the internal child block buffer locations into child block I/O pin locations (step 220). In the exemplary embodiment, physical cell generation program 110 identifies each of the internal buffers in the child block based on the unique names assigned in step 210. Physical cell generation program 110 then determines the x-y location of each internal buffer using, for example, a command in the EDA tool that returns the x-y location of a specified component. Physical cell generation program 110 then copies the x-y location of each pin into an HDL file (e.g., VHDL) describing the parent block as specific I/O locations for where the parent level logic crosses the movebound into the child block. In various embodiments, physical cell generation program 110 replaces the I/O locations determined in the synthesis with the locations as determined in the complete flat placement with the buffer pairs inserted and the attraction between the pairs set. The new I/O locations in the parent block translate to specific locations on the exclusive movebounds of the child block. The new I/O locations correspond to pin locations for the child block that the EDA tool determines based on both parent level logic and on child block logic because of the attraction attribute. Because the placement results in child block buffers that are not overlapping (i.e., occupying the same physical space on the chip), when physical cell generation program 110 converts the child block buffers into I/O pin locations, the I/O pin locations will also not be overlapping. Therefore, physical cell generation program 110 ensures that the placement of the I/O pins results in a legal placement, with no overlapping pins.

Physical cell generation program 110 runs a placement and optimization on the child block (step 222). In the exemplary embodiment, physical cell generation program 110 instructs the EDA tool to perform a placement and optimization on only the child block using the size of the child block specified in parameters file 106 and the I/O pin locations determined in step 220. By performing a separate placement and optimization on just the child block, physical cell generation program 110 ensures that the placement of logical components within the child block meet the circuit specifications for timing.

Physical cell generation program 110 puts the separately placed and optimized child block of step 222 into the complete flat parent block (step 224). In the exemplary embodiment, physical cell generation program 110 replaces the version of the child block that was placed in the full flat design in step 218 with the version of the child block that was separately placed and optimized in step 222 according to a hierarchical design. The result of inserting the separately placed and optimized child block into the parent block is a complete flat design that includes one or more child blocks that have separately placed logic that takes into account logic within the child block and logic outside of the child block through the placement of I/O pins at locations that depend on the parent level logic and the child block level logic. In various embodiments of the present invention, the foregoing steps of physical cell generation program 110 can be repeated for each of one or more child blocks within a parent block of an IC.

Figure 3:
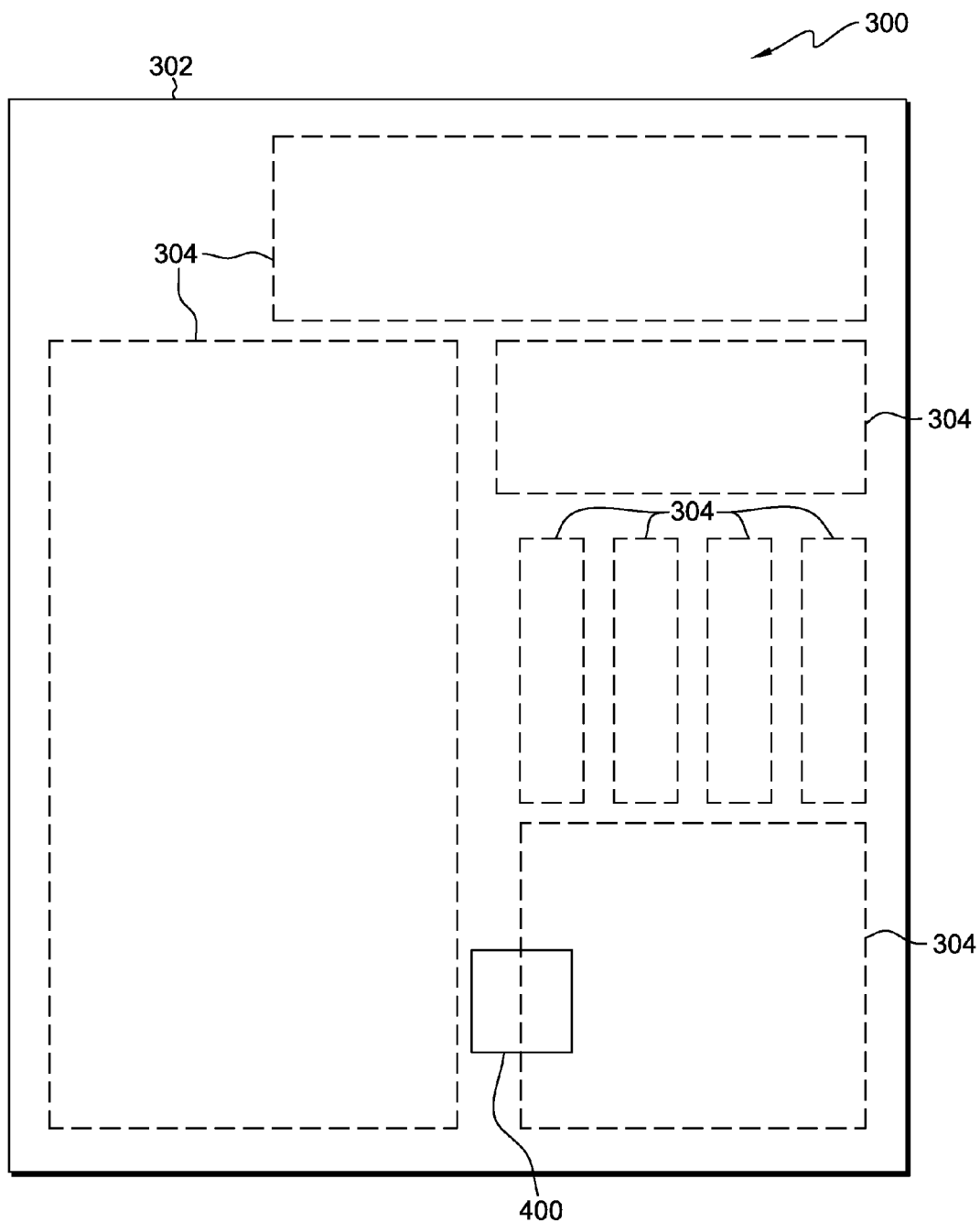
FIG. 3 is a block diagram depicting a parent level view of an integrated circuit model, in accordance with an embodiment of the present invention.

FIG. 3 is a block diagram depicting a parent level view of an IC model, generally designated 300, in accordance with an embodiment of the present invention. IC model 300 includes parent block 302 and child blocks 304. In various embodiments of the present invention, parent block 302 is a top-level model of an IC. In some embodiments, parent block 302 represents a hierarchical view of the IC having a plurality of child blocks 304. In various embodiments of the present invention, child blocks 304 represent a plurality of timing critical circuits within the IC that can be modeled as stand-alone components within the IC that undergo a separate placement and optimization by the EDA tool. In various embodiments of the present invention, parent block 302 includes one or more electrical components connected to one or more electrical components within child blocks 304 (i.e., a net crosses the boundary between parent block 302 and child block 304). IC model 300 includes boundary 400. Boundary 400 is a region of IC model 300 that represents a location of at least one net crossing from parent block 302 into child block 304. Boundary 400 is discussed in greater detail with respect to FIG. 4.

Figure 4:
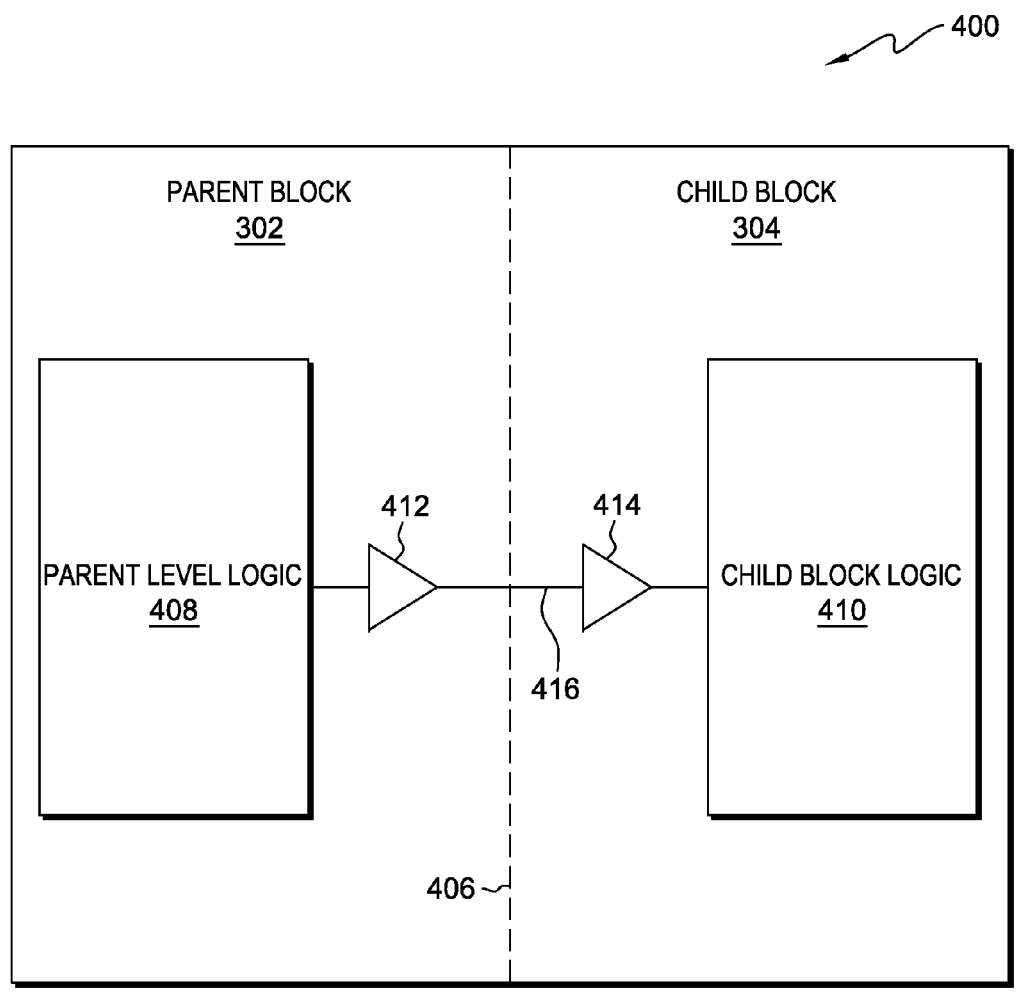
FIG. 4 is a block diagram depicting a boundary between parent level logic and child block logic of an integrated circuit model, in accordance with an embodiment of the present invention.

FIG. 4 is a block diagram depicting boundary 400 between parent block 302 and child block 304 of IC model 300, in accordance with an embodiment of the present invention. In the depicted embodiment, parent block 302 includes parent level logic 408 and buffer 412. In the depicted embodiment, child block 304 includes child block logic 410 and buffer 414. Parent block 302 and child block 304 are separated by movebound 406. In this embodiment, net 416 connects buffer 412 and buffer 414 by crossing movebound 406. In some embodiments, physical cell generation program 110 identifies net 416 crossing movebound 406 and inserts buffer 412 in parent block 302 and buffer 414 in child block 414. The location of buffer 414 can later be inserted as the location of an I/O pin for child block 304.

Figure 5:
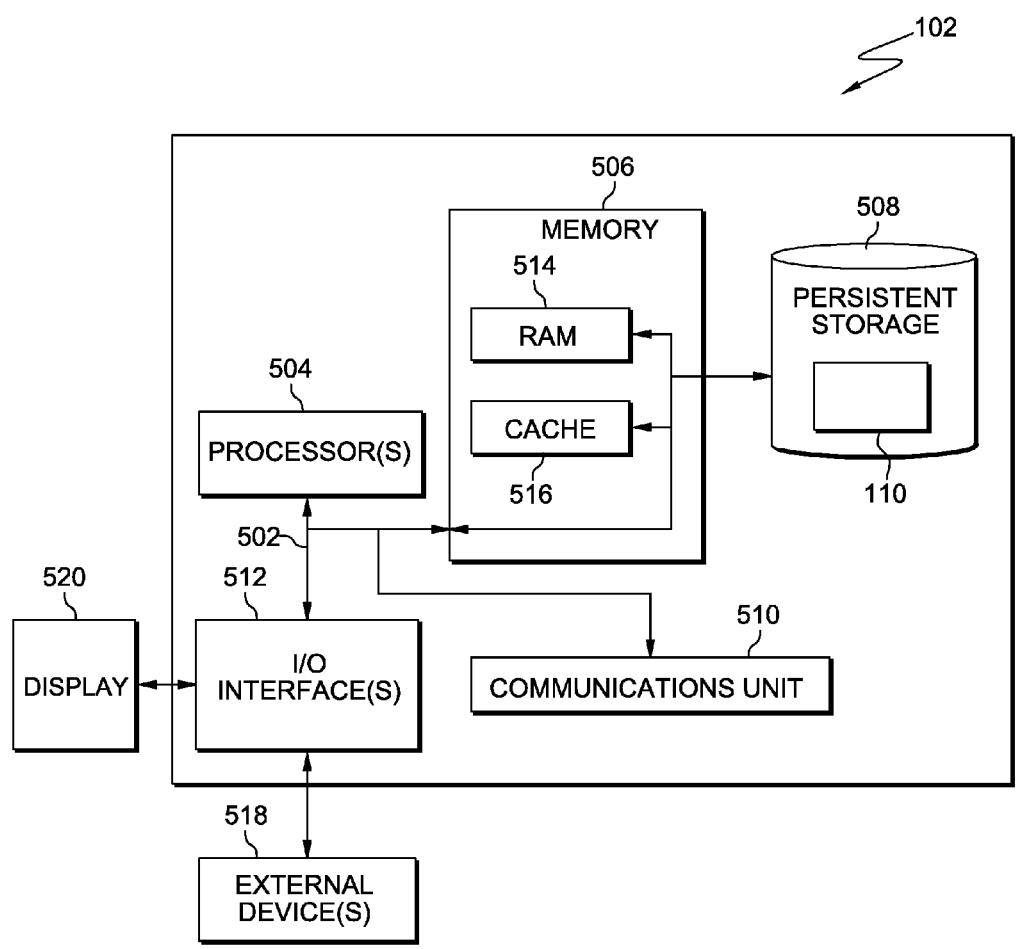
FIG. 5 depicts a block diagram of components of the computer system executing the physical cell generation program, in accordance with an embodiment of the present invention.

FIG. 5 depicts a block diagram of components of computer system 102 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computer system 102 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Physical cell generation program 110 is stored in persistent storage 508 for access and/or execution by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Physical cell generation program 110 may be downloaded to persistent storage 508 through communications unit 510.

I/O interface(s) 512 allows for input and output of data with other devices that may be connected to computer system 102. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., physical cell generation program 110, can be stored on such portable computer-readable storage media and can be loaded onto persistent storage 508 via I/O interface(s) 512. I/O interface(s) 512 also connect to a display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for optimizing an integrated circuit design, the method comprising:
    identifying, by one or more computer processors, one or more nets crossing a boundary between a parent block, having parent logic, and a child block, having child logic;
    inserting, by the one or more computer processors, based on a flat placement, one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets;
    determining, by the one or more computer processors, a first flat placement for the parent logic and a second flat placement for the child logic such that the at least one interior buffer and the at least one exterior buffer in the buffer pair for each net are placed substantially near to one another; and
    determining, by the one or more computer processors, one or more pin locations for the child block based, at least in part, on the second flat placement for the child logic.

2. The method of claim 1, further comprising:
    determining, by the one or more computer processors, a third flat placement for the child logic based, at least in part, on the one or more pin locations; and
    replacing, by one or more computer processors, the second flat placement with the third flat placement.

3. The method of claim 1, further comprising:
    assigning, by the one or more computer processors, an attraction value to each buffer pair of the one or more nets.

4. The method of claim 3, wherein determining the first flat placement and the second flat placement is based, at least in part, on the attraction value assigned to each buffer pair of the one or more nets.

5. The method of claim 1, wherein the boundary between the parent block and the child block is an exclusive movebound.

6. The method of claim 1, wherein determining the second flat placement comprises placing the one or more interior buffers so that the one or more interior buffers are not overlapping.

7. The method of claim 1, wherein the one or more interior buffers and the one or more exterior buffers are circuit elements that preserve clock phase signal polarity.

8. A computer program product for optimizing an integrated circuit design, the computer program product comprising:
    one or more computer-readable storage media and program instructions stored on the one or more computer-readable storage media, the program instructions comprising:
        program instructions to identify one or more nets crossing a boundary between a parent block, having parent logic, and a child block, having child logic;
        program instructions to insert, based on a flat placement, one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets;
        program instructions to determine a first flat placement for the parent logic and a second flat placement for the child logic, such that the at least one interior buffer and the at least one exterior buffer in the buffer pair for each net are placed substantially near to one another; and
        program instructions to determine one or more pin locations for the child block based, at least in part, on the second flat placement for the child logic.

9. The computer program product of claim 8, further comprising:

program instructions to determine a third flat placement for the child logic based, at least in part, on the one or more pin locations; and program instructions to replace the second flat placement with the third flat placement.

10. The computer program product of claim 8, further comprising:
program instructions to assign an attraction value to each buffer pair of the one or more nets.

11. The computer program product of claim 10, wherein determining the first flat placement and the second flat placement is based, at least in part, on the attraction value assigned to each buffer pair of the one or more nets.

12. The computer program product of claim 8, wherein the boundary between the parent block and the child block is an exclusive movebound.

13. The computer program product of claim 8, wherein determining the second flat placement comprises placing the one or more interior buffers so that the one or more interior buffers are not overlapping.

14. The computer program product of claim 8, wherein the one or more interior buffers and the one or more exterior buffers are circuit elements that preserve clock phase signal polarity.

15. A computer system for optimizing an integrated circuit design, the computer system comprising:
one or more computer processors;
one or more computer-readable storage media;
program instructions stored on the computer-readable storage media for execution by at least one of the one or more processors, the program instructions comprising:
program instructions to identify one or more nets crossing a boundary between a parent block, having parent logic, and a child block, having child logic;
program instructions to insert, based on a flat placement, one or more interior buffers on the one or more nets inside of the child block and one or more exterior buffers on the one or more nets outside of the child block and inside of the parent block, such that each of the one or more nets includes at least one interior buffer and at least one exterior buffer, wherein the at least one interior buffer and the at least one exterior buffer define a buffer pair for each of the one or more nets;
program instructions to determine a first flat placement for the parent logic and a second flat placement for the child logic, such that the at least one interior buffer and the at least one exterior buffer in the buffer pair for each net are placed substantially near to one another; and
program instructions to determine one or more pin locations for the child block based, at least in part, on the second flat placement for the child logic.

16. The computer system of claim 15, further comprising:
program instructions to determine a third flat placement for the child logic based, at least in part, on the one or more pin locations; and
program instructions to replace the second flat placement with the third flat placement.

17. The computer system of claim 15, further comprising:
program instructions to assign an attraction value to each buffer pair of the one or more nets.

18. The computer system of claim 17, wherein determining the first flat placement and the second flat placement is based, at least in part, on the attraction value assigned to each buffer pair of the one or more nets.

19. The computer system of claim 15, wherein the boundary between the parent block and the child block is an exclusive movebound.

20. The computer system of claim 15, wherein determining the second flat placement comprises placing the one or more interior buffers so that the one or more interior buffers are not overlapping.

* * * * *